(12) United States Patent
Bernard et al.

(10) Patent No.: US 7,159,187 B2
(45) Date of Patent: Jan. 2, 2007

(54) IN-CONTEXT CREATION AND EDITING OF MASKS AND WAVEFORMS

(75) Inventors: Kyle L. Bernard, Tigard, OR (US); Craig D. Bryant, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 787 days.

(21) Appl. No.: 10/011,821

(22) Filed: Nov. 6, 2001

(65) Prior Publication Data
US 2003/0085925 A1    May 8, 2003

(51) Int. Cl.
*G06F 17/00* (2006.01)
*G01R 13/00* (2006.01)

(52) U.S. Cl. .................................... 715/771; 702/68
(58) Field of Classification Search ............ 345/440.1, 345/676; 715/771, 970; 702/68, 124, 67, 702/69, 71, 70, 72, 73, 74, 75, 76, 77, 78, 702/79, 125, 126, 66, 193, 190; 382/207, 382/208, 209, 210, 211, 212, 217, 194
See application file for complete search history.

(56) References Cited

U.S. PATENT DOCUMENTS 5,818,975 A * 10/1998 Goodwin et al. ........... 382/274
6,300,955 B1 * 10/2001 Zamir ......................... 382/283
6,320,577 B1 * 11/2001 Alexander ................ 345/440.1
6,356,850 B1 * 3/2002 Wilstrup et al. .............. 702/69
6,584,419 B1 * 6/2003 Alexander .................... 702/68
6,642,926 B1 * 11/2003 Letts ........................ 345/440.1
2002/0093514 A1 * 7/2002 Edwards et al. ............ 345/626

OTHER PUBLICATIONS

"User's Guide, HP 54655A and HP 54656A Test Automation Modules", (c) 1991, Hewlett-Packard Company, pp. 1-60 and 119-121.*
"User's Guide, Agilent 54657A, 54658A, and 54659G Measuremetn/Storage Modules." © 2000. Agilent Technologies.*

* cited by examiner

*Primary Examiner*—Tadesse Hailu
*Assistant Examiner*—Blaine Basom
(74) *Attorney, Agent, or Firm*—Francis I. Gray

(57) ABSTRACT

A method of creation/editing masks/waveforms for an instrument invokes a mask editor from an application running on the instrument. A context or signal waveform displayed in the application is transferred as a reference to a mask editor graphic display together with an unrelated current mask, which may be a previously existing mask or a default mask. The current mask is edited with respect to the reference to define a new mask, such as by changing the positions of points, adding points or deleting points that define the current mask. Then the mask editor is exited and the application recalled, with the new mask being applied to the context in the application.

21 Claims, 5 Drawing Sheets

IN-CONTEXT CREATION AND EDITING OF MASKS AND WAVEFORMS

BACKGROUND OF THE INVENTION

The current invention relates to the creation and editing of masks for waveform testing, and more particularly to an in-context creation and editing of masks and waveforms that does not use extra equipment and connections.

It has become common practice in various automated waveform testing situations to compare a waveform against a mask to provide an alarm or to capture waveform data when the waveform is out of limits according to the mask. For example the 2430 Oscilloscope manufactured by Tektronix, Inc. of Beaverton, Oreg. has a "Save-on-Delta" feature, U.S. Pat. No. 4,510,571, that allows the ability to automatically capture a waveform that falls outside a defined mask or template. The template may be a previously captured waveform plus or minus specified tolerances, or may be one generated by a computer and downloaded into the instrument. Also masks are used as measurement tools to either ride on a signal to provide an instantaneous measurement for the waveform, or to be manually adjusted to touch the waveform in order to provide a measurement for the waveform. Such an instrument is the VM700 Video Measurement Test Set manufactured by Tektronix, Inc. of Beaverton, Oreg. The adjustments do not provide for arbitrary adjustment, but merely scaling adjustments without altering the configuration of the mask or template. These masks or templates are preloaded into the instruments, with new or altered masks being generated by an external computer for downloading into the instruments.

What is desired is an easier/faster way to create/edit waveform templates or masks for a test instrument without the use of external equipment.

BRIEF SUMMARY OF THE INVENTION

Accordingly the present invention provides for in-context creation and editing of masks and waveforms by invoking a mask editor from an application of an instrument. A user sets up the instrument for a context of interest, such as the display of a signal waveform for which a mask is desired. The application transfers the context, i.e., signal waveform, to the mask editor and scales the resulting mask editor display to match the invoking application's display scale so that the mask editor displays the signal waveform as a visual reference, but doesn't base the mask on it, i.e., the context is available for reference but does not restrict what masks may be created. The user may rescale the signal waveform to show all mask points if points that define the mask are outside the mask editor display. After the mask is created/edited and the mask editor exited, the resulting mask is transferred back to the invoking application for immediate use, i.e., the mask is transferred back in-context to the application.

The objects, advantages and other novel features of the present invention are apparent from the following detailed description when read in conjunction with the appended claims and attached drawing.

DETAILED DESCRIPTION OF THE INVENTION

Figures 1, 2:
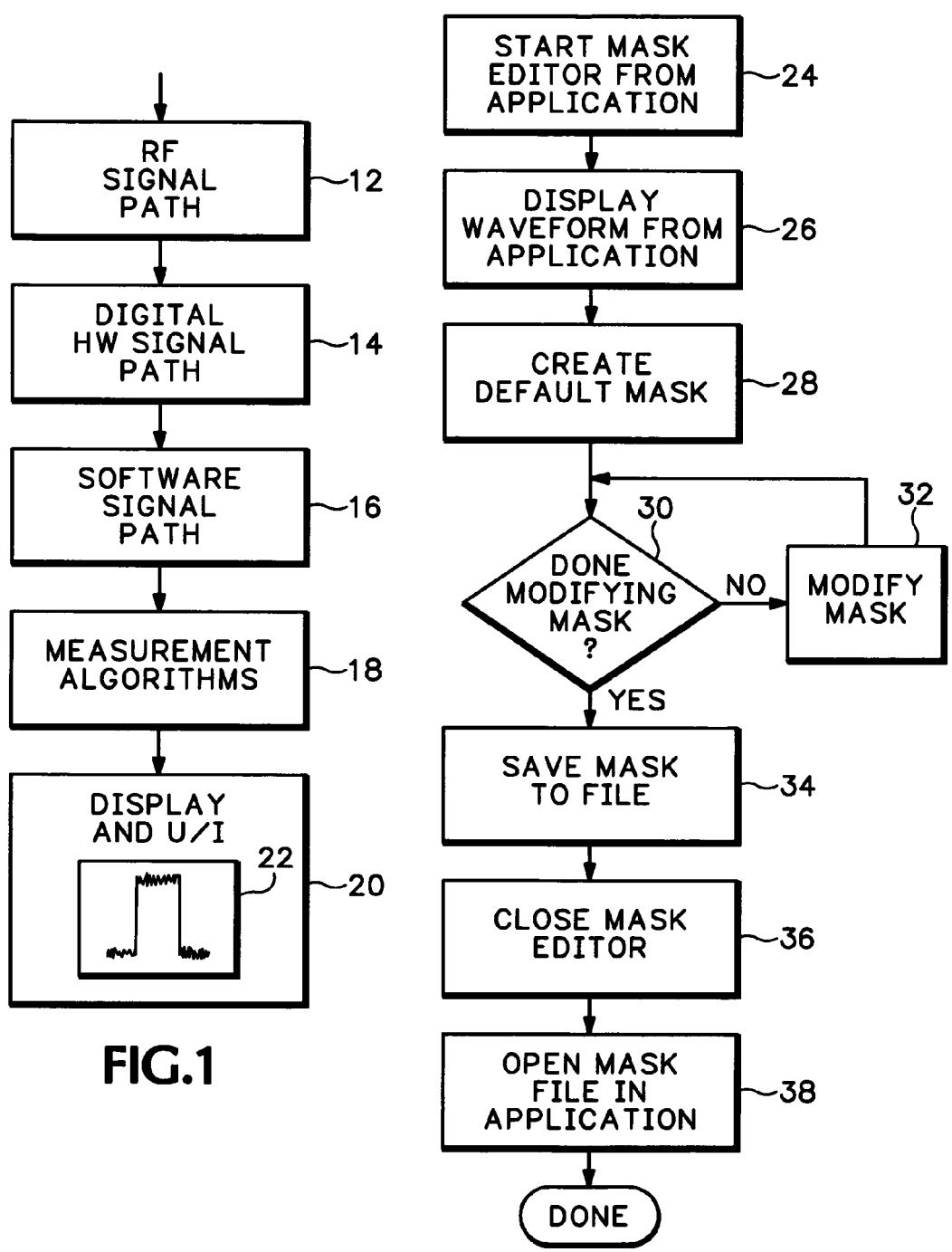
FIG. 1 is a block diagram view of an instrument signal path that may use in-context creation/editing of masks/waveforms according to the present invention.
FIG. 2 is a flow diagram view of the process for in-context creation/editing of masks/waveforms according to the present invention.

Referring now to FIG. 1 a typical signal path for a radio frequency (RF) signal through a test/measurement instrument is shown by way of illustration. The RF signal is processed by an RF signal path module 12 to down convert and filter the RF signal to a digital intermediate frequency (IF) signal. The digital IF signal is processed by a digital hardware (HW) module 14, which may include demodulation. The processed digital IF signal is then processed by a software (SW) module 16 for signal conditioning and demodulation, if not already done in the HW module 14. Which portions of the signal processing are handled by the HW module 14 and which by the SW module 16 is a matter of design choice. The conditioned digital IF signal is then processed by a measurement algorithms module 18 according to a user selected measurement category, such as interference RF tests, transmitter RF tests, transmitter modulation tests, etc. The results are provided to a display module 20 that also provides a user interface (UI). The display module 20 includes a display screen 22 for showing the context or signal data being processed.

The selected measurement algorithm or application may invoke a mask editor, as shown in FIG. 2 at step 24. The mask editor provides a graphic display of the context or waveform from the application at step 26. A previously selected mask or a default mask is provided as a current mask on the graphic display at step 28, which mask is unrelated to the displayed waveform. At steps 30 and 32 the current mask is modified as desired relative to the waveform to produce a new mask. When the modification is complete, the new mask is saved in a mask file at step 34, the mask editor is closed at step 36, and control is returned to the application. The mask file is then opened within the application at step 38 to complete the in-context mask creation/editing.

Figure 3:
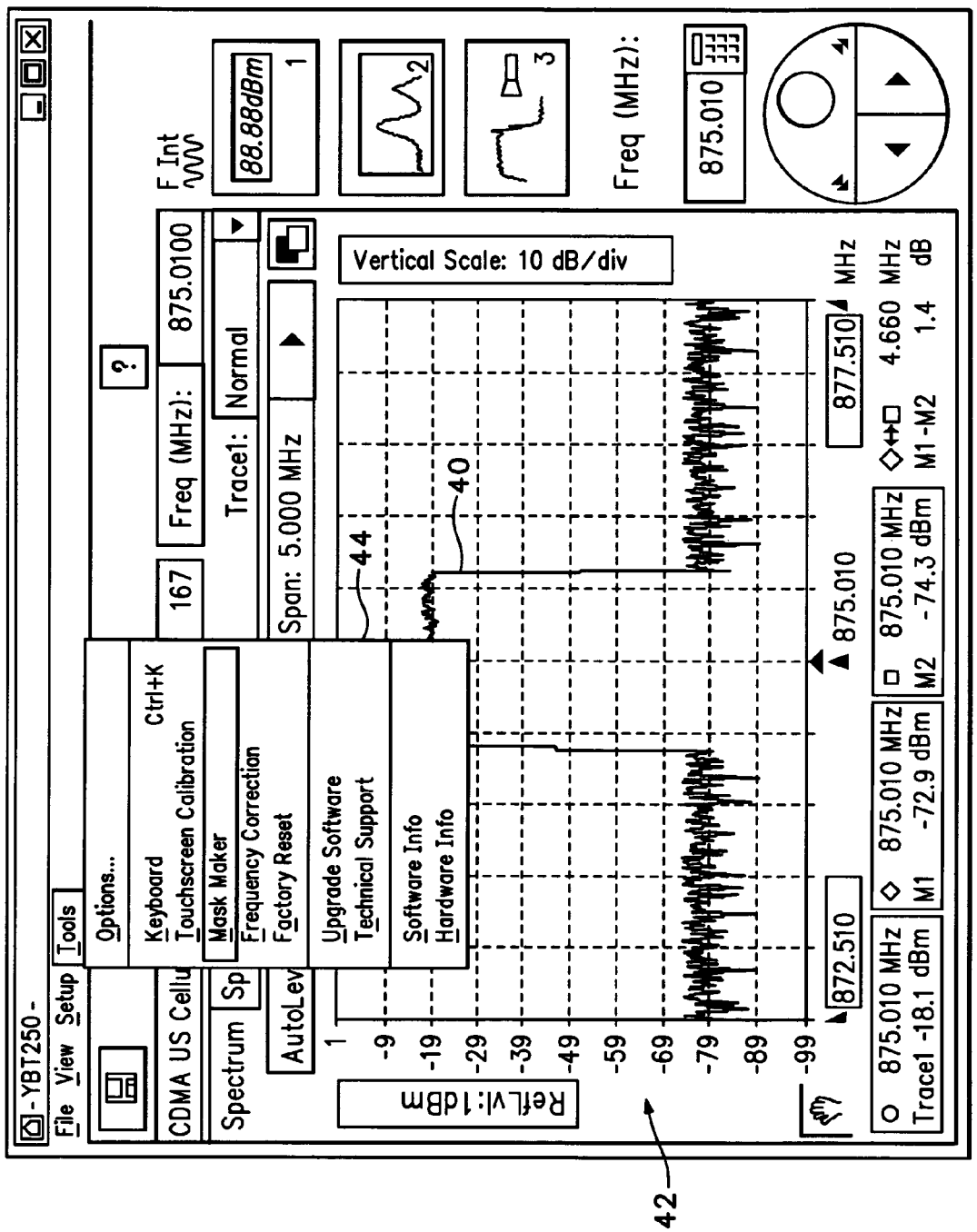
FIG. 3 is a plan view of an application screen invoking in-context creation/editing of masks/waveforms according to the present invention.
Figure 4:
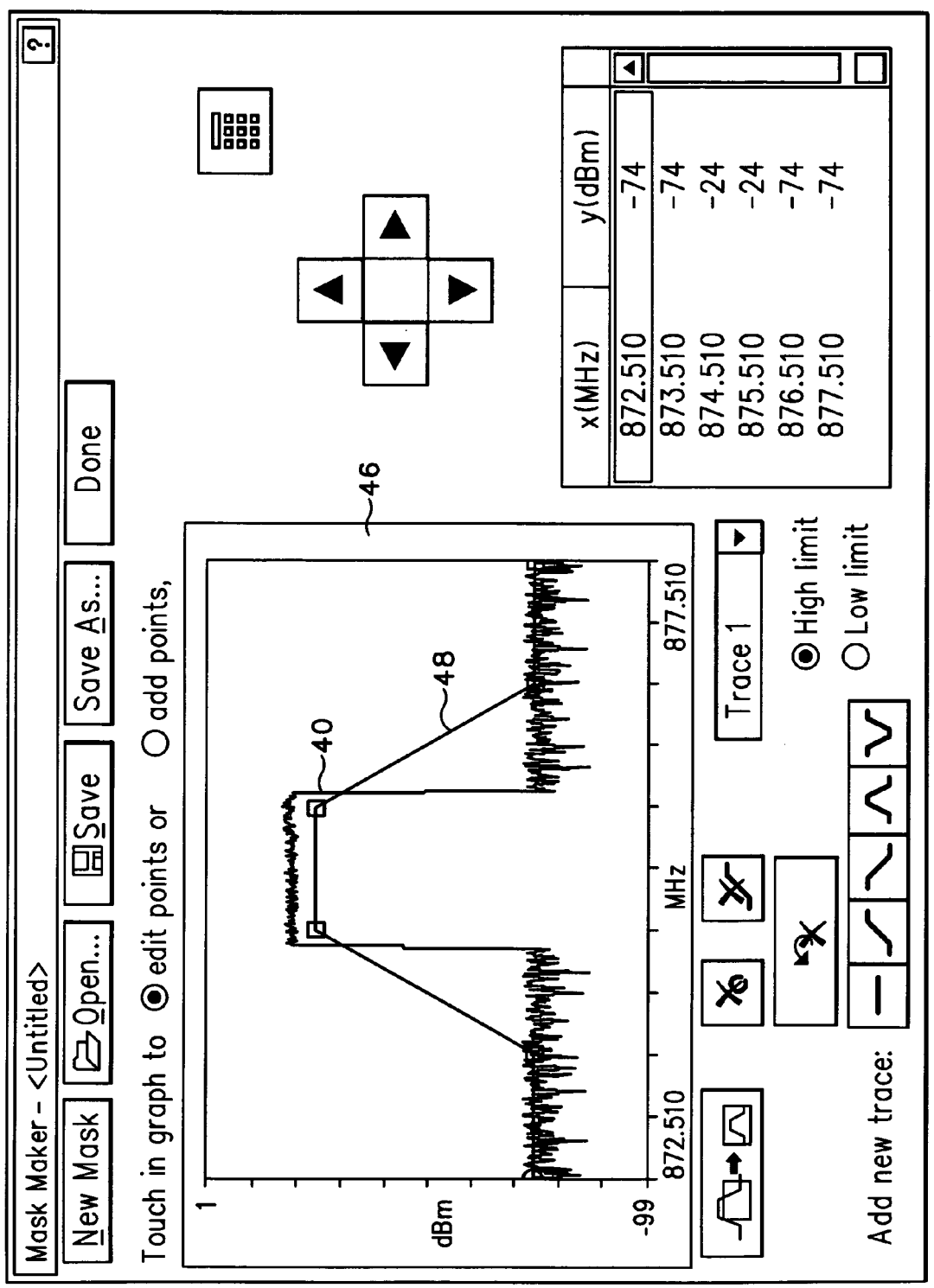
FIG. 4 is a plan view of a mask editor screen invoked for in-context creation/editing of masks/waveforms according to the present invention.
Figure 5:
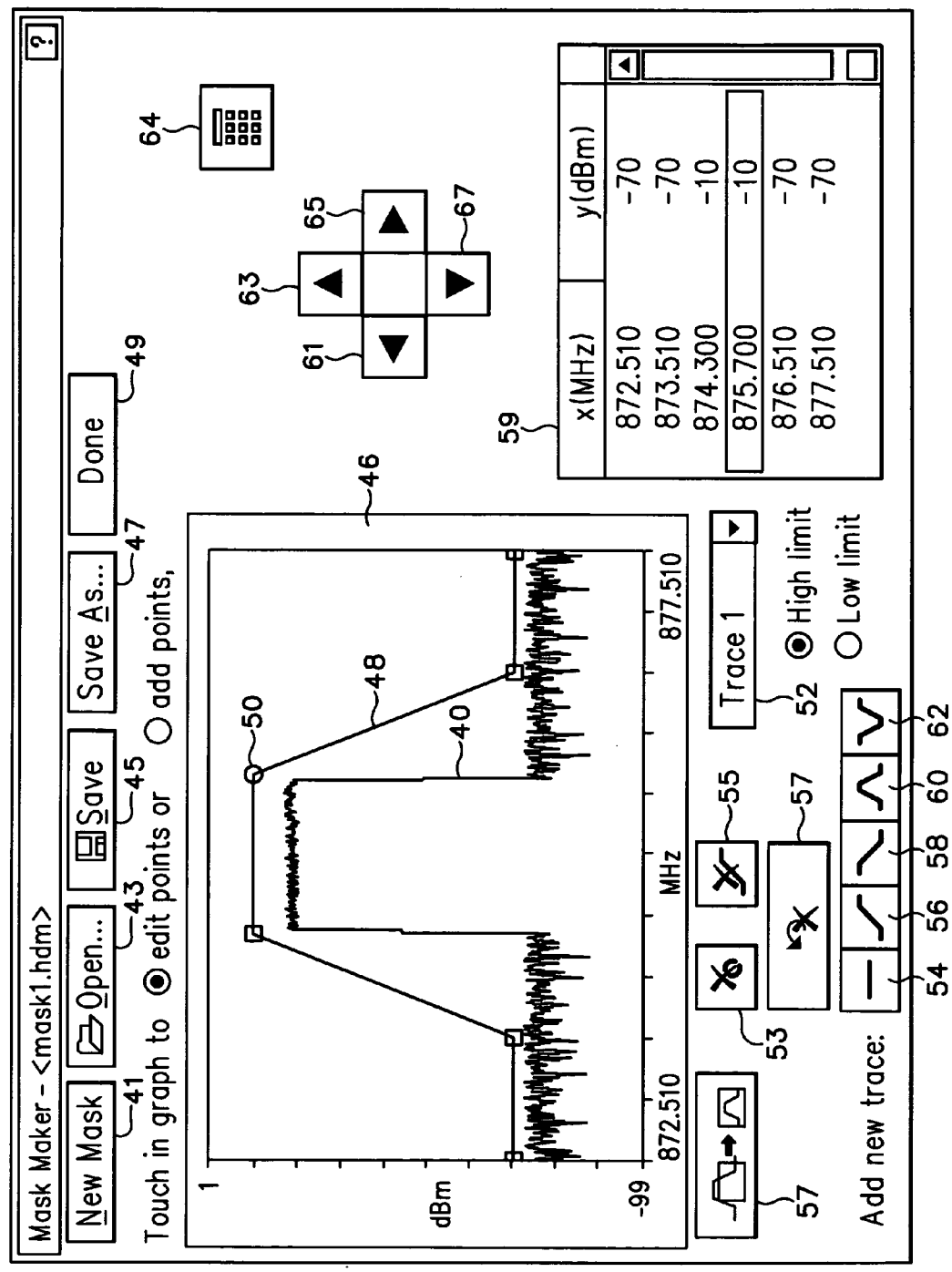
FIG. 5 is a plan view of a mask editor screen illustrating in-context creation/editing of masks/waveforms according to the present invention.

FIG. 3 shows a screen for an application, such as for analyzing a code division multiple access (CDMA) system, where a waveform 40 representing a portion of the RF signal is shown in a graphic display 42. In the illustrated implementation a pulldown menu 44 may be accessed to invoke the mask editor, entitled in this embodiment as "MaskMaker". Other means of invoking the mask editor may include a "button" on the screen that may be "touched". The application transfers the waveform to the mask editor and scales a mask editor graphic display 46 on the screen to match the invoking application's graphic display. A mask 48 also is displayed, but the mask editor displays the waveform as a visual reference and doesn't base the mask on it. As is known in the art the mask 48 may be a single trace as shown or may be multiple traces, such as for providing maximum and minimum limits.

As illustrated the mask editor screen may have a plurality of buttons 41, 43, 45, 47, 49 across the top of the screen, including NewMask, Open, Save, SaveAs and Done. The NewMask button 41 closes whatever current mask is being displayed and creates a default mask with the same units. The graphic display is reset to the same scale and position as when the mask editor was invoked, with the waveform showing. If the current mask being closed has unsaved changes, then a dialog box is invoked to ask if the changes should be saved or not. The default mask may be any desired one, such as a "traffic cone" shape mask with vertical values at approximately 25% and 75% of the graph height and horizontal values at 0%, 20%, 40%, 60%, 80% and 100% of the graph width. The Open button 43 invokes a standard Open dialog, such as is common to Windows® operating systems for example, to select a previously stored mask to replace the current mask. Likewise the Save button 45 invokes a standard Save dialog to save the current mask in an already specified file or in a new file identified by a user. The SaveAs button 47 also invokes the standard Save dialog to allow the user to identify a new file for the mask. Finally the Done button 49 exits the mask editor and returns to the invoking application. A dialog box is opened before exiting if there are unsaved changes to the mask.

Also provided is a selection between "edit points" or "add points". When "edit points" is selected, identifying a mask point 50 from the mask 48 selects that point and the trace, if more than one, to which it belongs. The mask point 50 may be identified by touching a touch screen, or by some other well-known means. The identified mask point 50 may then be "dragged" to a new location within the mask editor display 46. The new location may change the horizontal order of the mask points, causing the mask trace and grid text to change to the new ordering. When "add points" is selected and a location in the mask editor display 46 is identified, such as by touching or other suitable means, a new point is inserted into the mask 48 at that point. If the new point is at the exact same horizontal location of an existing mask point, the new point is inserted at the next horizontal position on one side or the other.

A rescale button 51 places all mask points for the current mask within the mask editor display. The left edge of the mask is at the minimum horizontal value for any mask point and the right edge of the mask is at the maximum horizontal value for any mask point. Mask points should be within the middle portion vertically, such as 90%, of the mask editor display 46. Rescale does not take the waveform into account. Buttons 53, 55, 57 are also provided for delete point, delete trace (all points that make up a mask trace) and undo delete. A trace selector 52 indicates which trace of a mask the selected point 50 is in and allows the user to select one of the existing traces. "High limit" assigns the selected trace of the mask to be a high limit for comparing against the waveform, and "low limit" assigns the selected trace of the mask to be a low limit for comparing against the waveform.

There are also "add new trace" buttons 54, 56, 58, 60, 62, the particular shape of the mask trace being indicated on the button. When any of the shape buttons are selected, a trace of that shape is added to the mask editor display 46 as part of the mask 48. The resulting mask trace may start and end at any specified points within the mask editor display 46, but typically starts at the display's left edge and ends at the display's right edge. A grid 59 contains columns for horizontal and vertical values for each point in the selected trace of the mask 48. Labels indicate the units. The grid 59 may be scrolled vertically if the number of mask points exceeds the size of the displayed grid. Arrow buttons 61, 63, 65, 67 are provided for incrementing or decrementing the selected mask point 50 by, for example, 0.5% horizontally and 1.0% vertically. Autorepeat may be included, but acceleration is not desirable. For example, when either the up or down arrow button 63, 67 is selected, the Y cell (shown highlighted) in the grid 59 for the selected point is selected, and when the left or right arrow button 61, 65 is selected, the X cell in the grid for the selected point is selected. A numeric button icon 64 may be selected to replace the arrow buttons with a numeric keypad (not shown). In this situation the arrow buttons 61, 63, 65, 67 are replaced with an arrow button icon (not shown).

Additionally colors may be used to highlight the various elements in the mask editor display 46. For example the waveform 40 may be gray, the selected mask trace may be bright blue with all other mask traces dark blue, and the selected point 50 may be a red circle with the other points being either a green square or magenta diamond.

Figure 6:
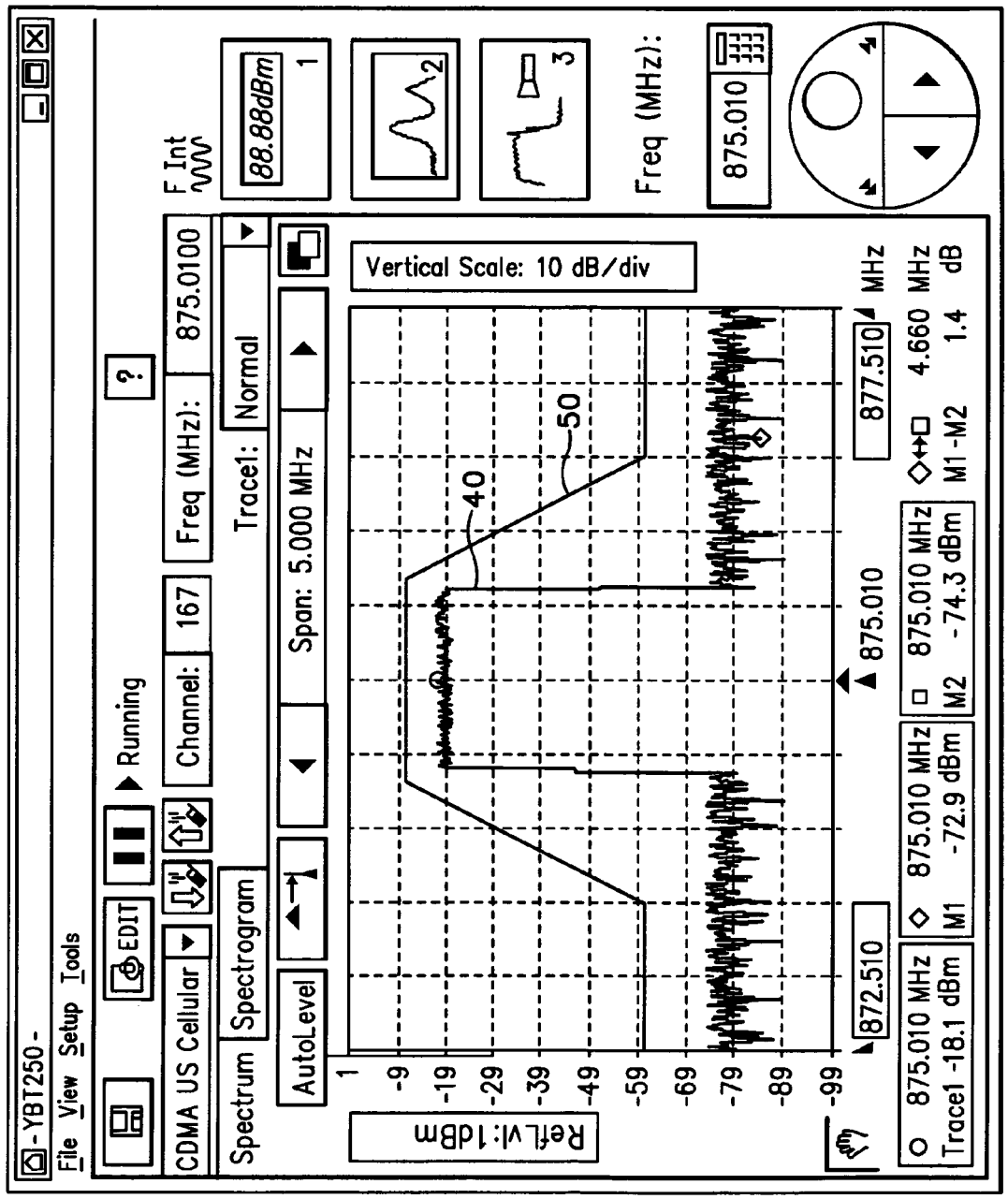
FIG. 6 is a plan view of an application screen illustrating import of a mask resulting from in-context creation/editing of masks/waveforms according to the present invention.

When the mask creation/editing is done and the Done button 49 activated, the mask editor is exited and the application is recalled as shown in FIG. 6 together with the current mask 48 from the mask editor in-context with the waveform 40.

The mask editor may also be useful for creating/editing waveforms for output by an arbitrary waveform generator, with a single trace being used and the points being manipulated as indicated above to form an idealized version of the waveform 40 or a pair of traces used to represent a modulating signal for another waveform that oscillates between the limits indicated by the traces. Also the user could use the numeric keypad to enter a tolerance around the displayed waveform, such as vertical +/−10% and horizontal +/−2 microseconds.

Thus the present invention provides a method of in-context creation and editing of masks and waveforms by invoking a mask editor from an application, presenting the waveform from the application in a graphic window with a current or default mask, editing the current mask to define a new mask, and returning to the application with the new mask for use in the application.

What is claimed is:

1. A method of creating and editing a mask for an instrument comprising the steps of:
    invoking a mask editor from an application running on the instrument that displays a waveform context;
    displaying the waveform context from the application in a graphic display within a graphic window as a reference together with a current mask as part of the mask editor, the waveform context and current mask being unrelated;
    editing the current mask with respect to the reference to define a new mask;
    exiting the mask editor to return to the application; and
    applying the new mask to the waveform context in the application.

2. The method as recited in claim 1 wherein the invoking step comprises the steps of:
    accessing a menu in the application; and
    selecting the mask editor from the menu.

3. The method as recited in claim 1 wherein the invoking step comprises the step of accessing a button in the application that represents the mask editor.

4. The method as recited in claim 1 further comprising the step of centering the current mask in the graphic window with the reference.

5. The method as recited in claim 1 wherein the editing step comprises the step of:
   selecting between an edit point function and an add paint function; and
   manipulating points that define the current mask according to the selected function to define the new mask.

6. The method as recited in claim 5 wherein the manipulating step when the edit point function is selected comprises the steps of:
   identifying a particular one of the points for the current mask;
   moving the particular one of the points to a new position within the graphic display; and
   repeating the identifying and moving steps until all the points necessary to define the new mask have been manipulated.

7. The method as recited in claim 5 wherein the manipulating step when the add point function is selected comprises the steps of:
   indicating a location within the graphic display; and
   placing a new point for the current mask at the indicated location to define the new mask.

8. The method as recited in claim 1 wherein the exiting step comprises the steps of:
   storing the new mask in a designated mask file; and
   returning control of the instrument to the application.

9. The method as recited in claim 8 wherein the applying step comprises the step of retrieving the new mask from the designated mask file for display with the waveform context.

10. A method of creating and editing a mask for generating an arbitrary waveform comprising the steps of:
    invoking a mask editor from an application running on an instrument that displays a waveform context;
    displaying the waveform context from the application in a graphic display within a graphic window as a reference together with a current mask as part of the mask editor, the waveform context and current mask being unrelated;
    editing the current mask with respect to the reference to define a new mask;
    exiting the mask editor to return to the application; and
    generating the arbitrary waveform based upon the new mask using an arbitrary waveform generator.

11. The method as recited in claim 10 wherein the invoking step comprises the steps of:
    accessing a menu in the application; and
    selecting the mask editor from the menu.

12. The method as recited in claim 10 wherein the invoking step comprises the step of accessing a button in the application that represents the mask editor.

13. The method as recited in claim 10 further comprising the step of centering the current mask in the graphic window with the reference.

14. The method as recited in claim 10 wherein the editing step comprises the step of:
    selecting between an edit point function and an add point function; and
    manipulating points that define the current mask according to the selected function to define the new mask.

15. The method as recited in claim 14 wherein the manipulating step when the edit point function is selected comprises the steps of:
    identifying a particular one of the points for the current mask;
    moving the particular one of the points to a new position within the graphic display; and
    repeating the identifying and moving steps until all the points necessary to define the new mask have been manipulated.

16. The method as recited in claim 14 wherein the manipulating step when the add point function is selected comprises the steps of:
    indicating a location within the graphic display; and
    placing a new point for the current mask at the indicated location to define the new mask.

17. The method as recited in claim 10 wherein the exiting step comprises the steps of:
    storing the new mask in a designated mask tile; and
    returning control of the instrument to the application.

18. The method as recited in claim 17 wherein the generating step comprises the step of retrieving the new mask from the designated mask file and generating the arbitrary waveform using the arbitrary waveform generator.

19. The method as recited in claim 10 wherein the editing step comprises forming an idealized waveform trace.

20. The method as recited In claim 10 wherein the editing step comprises forming a pair of traces to represent a modulating signal for the arbitrary waveform that oscillates between the limits indicated by the traces.

21. The method as recited in claim 10 wherein the editing step comprises specifying a tolerance around a displayed waveform.

\* \* \* \* \*